(12) United States Patent
Zhang et al.

(10) Patent No.: US 10,461,136 B2
(45) Date of Patent: Oct. 29, 2019

(54) ORGANIC ELECTROLUMINESCENT DISPLAY PANEL WITH SEMICONDUCTOR LAYER, MANUFACTURING METHOD FOR MANUFACTURING THE SAME, AND DISPLAY DEVICE

(71) Applicant: BOE Technology Group Co., Ltd., Beijing (CN)

(72) Inventors: Can Zhang, Beijing (CN); Xiaochuan Chen, Beijing (CN); Dongni Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/566,510

(22) PCT Filed: Jun. 29, 2017

(86) PCT No.: PCT/CN2017/090762
§ 371 (c)(1),
(2) Date: Oct. 13, 2017

(87) PCT Pub. No.: WO2018/113237
PCT Pub. Date: Jun. 28, 2018

(65) Prior Publication Data
US 2018/0301522 A1 Oct. 18, 2018

(51) Int. Cl.
H01L 27/32 (2006.01)
H01L 51/56 (2006.01)
(Continued)

(52) U.S. Cl.
CPC ...... H01L 27/3246 (2013.01); H01L 27/3211 (2013.01); H01L 51/5056 (2013.01);
(Continued)

(58) Field of Classification Search
CPC ............... H01L 27/3246; H01L 51/56; H01L 2227/323; H01L 2251/5392; H01L 51/5296
(Continued)

(56) References Cited

U.S. PATENT DOCUMENTS 7,985,966 B2 7/2011 Buechel et al.
2010/0264407 A1 10/2010 Murata et al.
(Continued)

FOREIGN PATENT DOCUMENTS

CN 101490866 A 7/2009
CN 101855743 A 10/2010
(Continued)

OTHER PUBLICATIONS

Nov. 30, 2017—(CN) First Office Action Appn 201611208526.4 with English Tran.
(Continued)

Primary Examiner — Nduka E Ojeh
(74) Attorney, Agent, or Firm — Banner & Witcoff, Ltd.

(57) ABSTRACT

An organic electroluminescent display panel and a method for manufacturing the same and a display device are disclosed. The organic electroluminescent display panel includes a base substrate, an anode and a cathode on the base substrate, and an organic light emitting layer located between the anode and the cathode, wherein the organic electroluminescent display panel further includes a semiconductor layer covering the entire base substrate, the semiconductor layer located between one of the anode and the cathode and the organic light emitting layer.

20 Claims, 6 Drawing Sheets

(51) Int. Cl.
*H01L 51/50* (2006.01)
*H01L 51/00* (2006.01)
*H01L 29/08* (2006.01)
*H01L 35/24* (2006.01)

(52) U.S. Cl.
CPC .......... *H01L 51/5072* (2013.01); *H01L 51/56* (2013.01); *H01L 2227/323* (2013.01); *H01L 2251/5392* (2013.01)

(58) Field of Classification Search
USPC .......................................... 257/40, E51.027
See application file for complete search history.

(56) References Cited

U.S. PATENT DOCUMENTS

| 2011/0068327 | A1* | 3/2011 | Morishima | ......... H01L 51/5052 257/40 |
| 2014/0332759 | A1* | 11/2014 | Meinhold | ........... H01L 51/5215 257/40 |
| 2015/0333115 | A1* | 11/2015 | Yang | ....................... H01L 27/12 257/40 |
| 2016/0149161 | A1* | 5/2016 | Lee | ..................... H01L 51/5271 257/40 |
| 2016/0240592 | A1 | 8/2016 | Li et al. | |
| 2017/0200901 | A1* | 7/2017 | Fujita | ................... C07D 513/04 |
| 2017/0346023 | A1* | 11/2017 | Jankus | ................ H01L 51/5068 |

FOREIGN PATENT DOCUMENTS

| CN | 102439197 A | 5/2012 |
| CN | 103915572 A | 7/2014 |
| CN | 104183713 A | 12/2014 |
| CN | 104183719 A | 12/2014 |
| CN | 104576944 A | 4/2015 |
| CN | 106784350 A | 5/2017 |

OTHER PUBLICATIONS

Aug. 11, 2017—(WO) International Search Report and Written Opinion Appn PCT/CN2017/090762 with English Tran.

\* cited by examiner

Forming a plurality of cathodes on a base substrate

Forming a semiconductor layer on the cathode, the semiconductor covering the entire base substrate Forming an organic light emitting layer on the semiconductor and forming an anode on the semiconductor layer

ORGANIC ELECTROLUMINESCENT DISPLAY PANEL WITH SEMICONDUCTOR LAYER, MANUFACTURING METHOD FOR MANUFACTURING THE SAME, AND DISPLAY DEVICE

The application is a U.S. National Phase Entry of International Application No. PCT/CN2017/090762 filed on Jun. 29, 2017, designating the United States of America and claiming priority to Chinese Patent Application No. 201611208526.4 filed on Dec. 23, 2016. The present application claims priority to and the benefit of the above-identified applications and the above-identified applications are incorporated by reference herein in their entirety.

TECHNICAL FIELD

Embodiments of the present disclosure relate to an organic electroluminescent display panel and a method for manufacturing the same and a display device.

BACKGROUND

After nearly two decades of rapid development, there was a qualitative leap in material synthesis, device preparation and process integration for Organic Light Emitting Diode (OLED). As OLED has high efficiency, high brightness, high contrast, low power consumption, fast response, flexible display and many other advantages, OLED has become the most powerful competitors for the next generation of mainstream flat panel display technology.

As depicted by FIG. 1, a pixel structure of OLED according to conventional arts comprises a plurality of thin film transistor array circuits 11 on a substrate 10, an anode 12 on the thin film transistor array circuit 11, a pixel definition layer 13 on the anode 12, an organic light emitting layer 14 on the pixel definition layer 13, and a cathode 15 on the light emitting layer 14. The pixel definition layer 13 functions to coat the edge of the anode 12, and define the light emitting area of the OLED. Since a metal oxide such as indium tin oxide (ITO) is generally used as the anode 12 of the OLED, and ITO has a great crystal grain. And at the same time, the edge of the etched ITO is straight, almost at right angles of 90°, and the thickness of the ITO electrode is great, typically 1500 Å to 2000 Å. If there is no pixel definition layer 13, it is easy for the cathode 15 to short-circuit with the anode 12 at a 90° right angle of the edge of the anode 12, such as a short circuit at a position indicated by the dotted line region 16 in the figure.

However, the presence of the pixel definition layer reduces the light emitting area, and in particular, the pixel area is required to be as small as possible in the present trend of high resolution display, and the presence of the pixel definition layer further reduces the light emitting area, such that requirements for efficiency and life expectancy are further raised.

SUMMARY

At least one embodiment of the present disclosure provides an organic electroluminescent display panel comprising a base substrate, an anode and a cathode on the base substrate, and an organic light emitting layer located between the anode and the cathode, wherein the organic electroluminescent display panel further comprises a semiconductor layer covering the entire base substrate, the semiconductor layer located between one of the anode and the cathode and the organic light emitting layer.

In the organic electroluminescent display panel according to embodiments of the present disclosure, as the organic electroluminescent display panel comprises a semiconductor layer covering the entire base substrate and the semiconductor layer has a low conductivity in usual cases, it can serve to coat the edge of the anode and prevent short circuit between the cathode and the anode. Therefore, the usual pixel definition layer can be removed in embodiments of the present disclosure, and the light emitting area of the pixel is increased.

In one embodiment according to the present disclosure, a value of current flowing through the semiconductor layer is greater than a value of current required for lightening the organic electroluminescent display panel; the value of current flowing through the semiconductor layer is a value of current corresponding to a turn-on voltage of the thin film transistor when the thin film transistor in the thin film transistor array circuit of the light emitting display panel is turned on.

In one embodiment according to the present disclosure, the semiconductor layer is made of an organic compound semiconductor, an amorphous semiconductor, or an oxide semiconductor.

In one embodiment according to the present disclosure, the amorphous semiconductor layer is made of an amorphous silicon semiconductor.

In one embodiment according to the present disclosure, a thickness of the semiconductor layer is in a range of 500 Å to 1000 Å.

In one embodiment according to the present disclosure, the anode is made of a metal material or a transparent conductive material; the cathode is made of a metal material or a transparent conductive material.

In one embodiment according to the present disclosure, the organic electroluminescent display panel further comprises a hole injection layer located between the anode and the organic light emitting layer.

In one embodiment according to the present disclosure, when the semiconductor layer is located between the anode and the organic light-emitting layer, the hole injection layer is located between the anode and the semiconductor layer or between the semiconductor layer and the organic light-emitting layer; and when the semiconductor layer is located between the cathode and the organic light-emitting layer, the hole injection layer is located between the anode and the organic light-emitting layer.

In one embodiment according to the present disclosure, the organic electroluminescent display panel comprises an electron transport layer located between the cathode and the organic light emitting layer.

In one embodiment according to the present disclosure, when the semiconductor layer is located between the anode and the organic light emitting layer, the electron transport layer is located between the organic light emitting layer and the cathode; and when the semiconductor layer is located between the cathode and the organic light emitting layer, the electron transport layer is located between the cathode and the semiconductor layer or between the semiconductor layer and the organic light emitting layer.

At least one embodiment of the present disclosure further provides a display device comprising the organic electroluminescent display panel as described above.

At least one embodiment of the present disclosure further provides a method for manufacturing an organic electroluminescent display panel comprising forming an anode, an organic light emitting layer and a cathode on a base substrate, wherein the method further comprises: forming a semiconductor layer between the anode and the cathode, the semiconductor layer covering the entire base substrate.

In one embodiment of the present disclosure, prior to forming a semiconductor layer between the anode and the cathode, the method comprises: forming the anode on the base substrate; and depositing the semiconductor layer on the anode through chemical vapor deposition.

In one embodiment of the present disclosure, prior to forming a semiconductor layer between the anode and the cathode, the method comprises: forming the cathode on the base substrate; and depositing the semiconductor layer on the cathode through chemical vapor deposition.

In one embodiment of the present disclosure, prior to forming an anode, an organic light emitting layer and a cathode on the base substrate, the method comprises: forming a plurality of thin film transistor array circuits arranged in matrix on the base substrate; a value of current flowing through the semiconductor layer is greater than a value of current required for lightening the organic electroluminescent display panel; the value of current flowing through the semiconductor layer is a value of current corresponding to a turn-on voltage of the thin film transistor when the thin film transistor in the thin film transistor array circuit is turned on.

In one embodiment of the present disclosure, the semiconductor layer is made of an organic compound semiconductor, an amorphous semiconductor, or an oxide semiconductor.

In one embodiment of the present disclosure, a hole injection layer is formed between the anode and the organic light emitting layer.

In one embodiment of the present disclosure, an electron transport layer is formed between the organic light emitting layer and the cathode.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

FIG. 3 is a schematic view of the conductivity at different positions of the semiconductor layer according to an embodiment of the present disclosure when the thin film transistor in an organic electroluminescent display panel is turned on;

DETAILED DESCRIPTION

Figure 1:
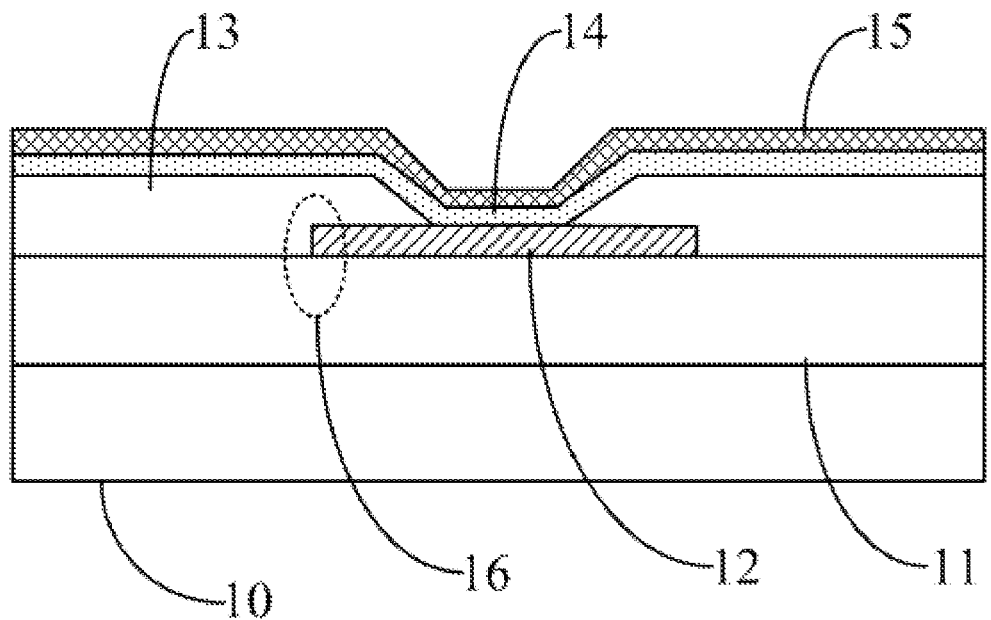
FIG. 1 shows the structure of an organic electroluminescent display panel according to the conventional art.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

An organic electroluminescent display panel according to an embodiment of the present disclosure and a method for manufacturing the same will be described in detail with reference to the accompanying drawings.

The thickness and area of the film in the drawings are not the actual proportions of the respective layers, and the purpose is merely illustrative of the present disclosure.

At least one embodiment of the present disclosure provides an organic electroluminescent display panel and a method for manufacturing the same, and a display device, for removing the usual pixel definition layer and increasing the light emitting area of the pixel.

Figure 2A:
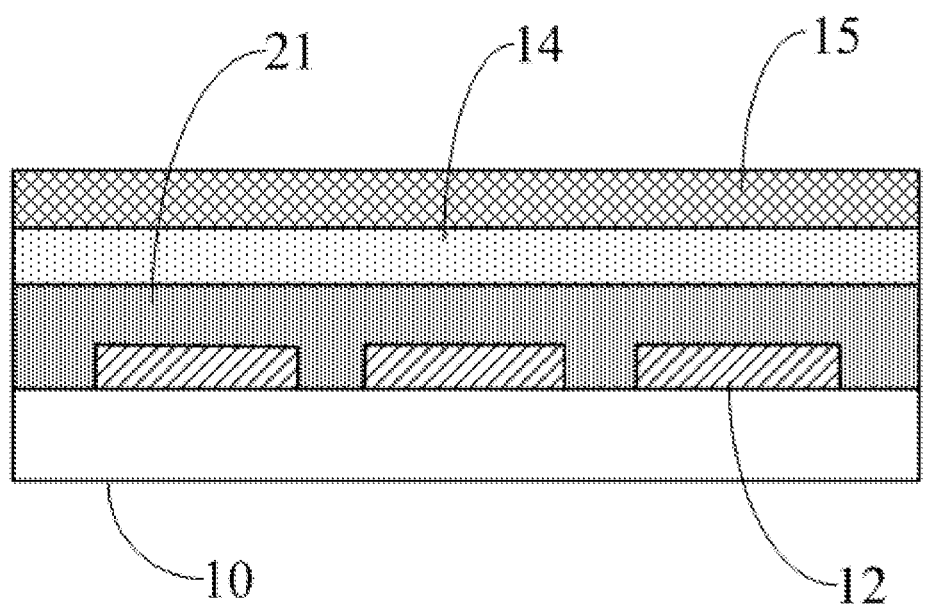
FIGS. 2a and 2b are schematic structural views of an organic electroluminescent display panel according to one embodiment of the present disclosure.
Figure 2B:
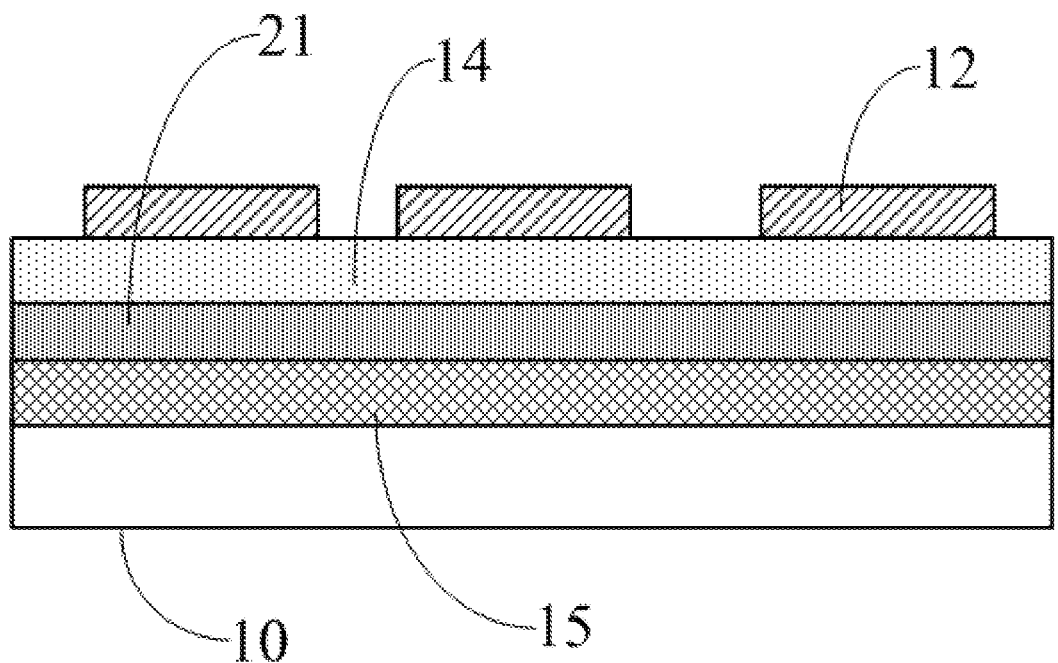

FIGS. 2a and 2b illustrate an organic electroluminescent display panel according to one embodiment of the present disclosure comprising a base substrate 10, an anode 12 and a cathode 15 on the base substrate 10, and an organic light emitting layer located between the anode 12 and the cathode 15, the organic electroluminescent display panel further comprising a semiconductor layer 21 covering the entire base substrate 10, the semiconductor layer 21 located between one of the anode layer 12 and the cathode 15 and the light-emitting layers 14. For example, the semiconductor layer 21 is located between the anode 12 and the organic light emitting layer 14, as illustrated in FIG. 2a. Or, the semiconductor layer 21 is located between the cathode 15 and the organic light emitting layer 14, as illustrated in FIG. 2b.

In one embodiment of the present disclosure, the anode 12 is located on the base substrate 10 and the cathode 15 is located above the anode 12, as illustrated in FIG. 2a. In another embodiment of the present disclosure, the cathode 15 is located on the base substrate 10 and the anode 12 is located above the cathode 15, as illustrated in FIG. 2b.

In the organic electroluminescent display panel according to the present embodiment, the semiconductor layer has a low conductivity in usual case, and serves to coat the edge of the anode to prevent a short circuit between the cathode and the anode, thereby removing the conventional pixel definition layer, and increasing the light emitting area of the pixel.

The organic electroluminescent display panel according to the present embodiment is described hereinafter by taking an organic electroluminescent display panel with an anode formed on the base substrate as an example.

Figure 3:
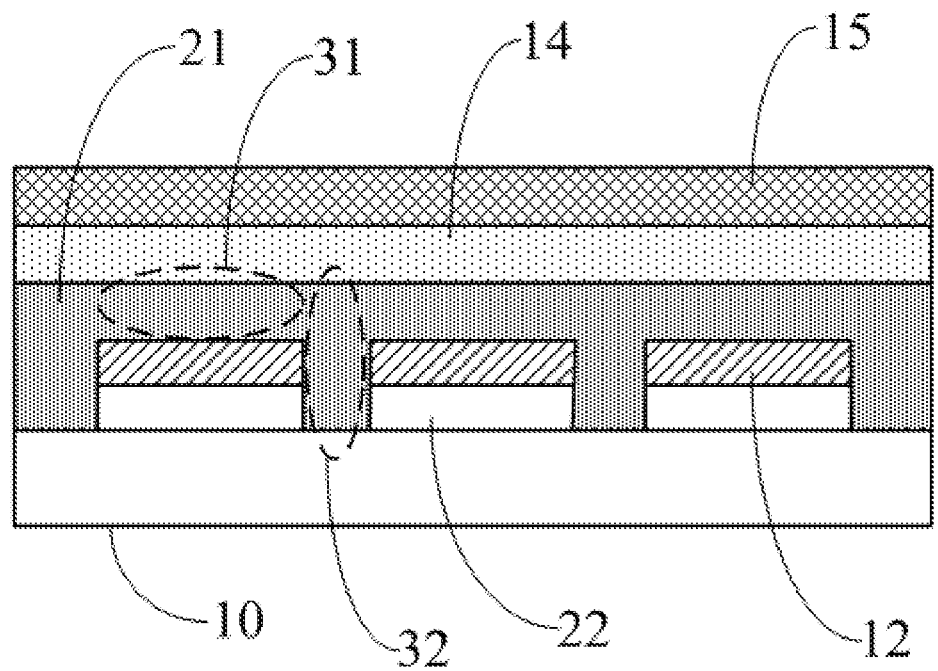

As illustrated in FIG. 3, the organic electroluminescent display panel comprises a plurality of thin film transistor array circuits 22 arranged in matrix on a base substrate 10, and the thin film transistor array circuit 22 is arranged in a manner similar to that of the conventional arts and will not be elaborated here.

As illustrated in FIG. 3, when the pixel corresponding to the dotted line region 31 needs to be turned on, the semiconductor layer 21 located above the anode 12 (the semiconductor layer 21 corresponding to the dotted line region 31) becomes a conductor due to the presence of the gate voltage, which can be used as a part of the anode 12 for transferring the holes to the organic light emitting layer 14, while for the semiconductor layer 21 which is not above the anode 12 (in the semiconductor layer 21 corresponding to the dotted line 32 as illustrated) is equal to an insulator due to absence of the gate voltage, and no leakage current is generated.

In the embodiment of the present disclosure, the semiconductor layer is an organic compound semiconductor layer, or can be an amorphous semiconductor layer. Of course, the semiconductor layer can also be an oxide semiconductor layer, such as an indium gallium zinc oxide semiconductor layer.

When the semiconductor layer is an amorphous semiconductor layer, the amorphous semiconductor layer can be selected as an amorphous silicon semiconductor layer. It is more convenient to select material for amorphous silicon semiconductor layer, and the material cost is relatively low, and current-voltage curve of amorphous silicon semiconductor layer is more stable.

In one embodiment of the present disclosure, thickness of the semiconductor layer is in a range of 500 Å to 1000 Å. In the present disclosure, the thickness value of the semiconductor layer refers to the thickness value of the film layer deposited at the time of production of the semiconductor layer; the semiconductor layer at this thickness can form a more uniform film layer and can coat the edge of the anode better.

In one embodiment of the present disclosure, the anode is made of a metal material or a transparent conductive material, and the cathode is made of a metal material or a transparent conductive material. Metal materials can be selected from molybdenum (Mo), aluminum (Al) and other single-layer metal or a composite metal formed of multi-layer metal, and t indium tin oxide (ITO) and other transparent conductive material can be selected as transparent conductive material. When the anode is made of a metal material and the cathode is made of a transparent conductive material, the organic electroluminescent display panel is a top emission type; when the anode is made of a transparent conductive material and the cathode material is made of a metal material, the organic electroluminescent display panel is a bottom emission type.

Figure 4:
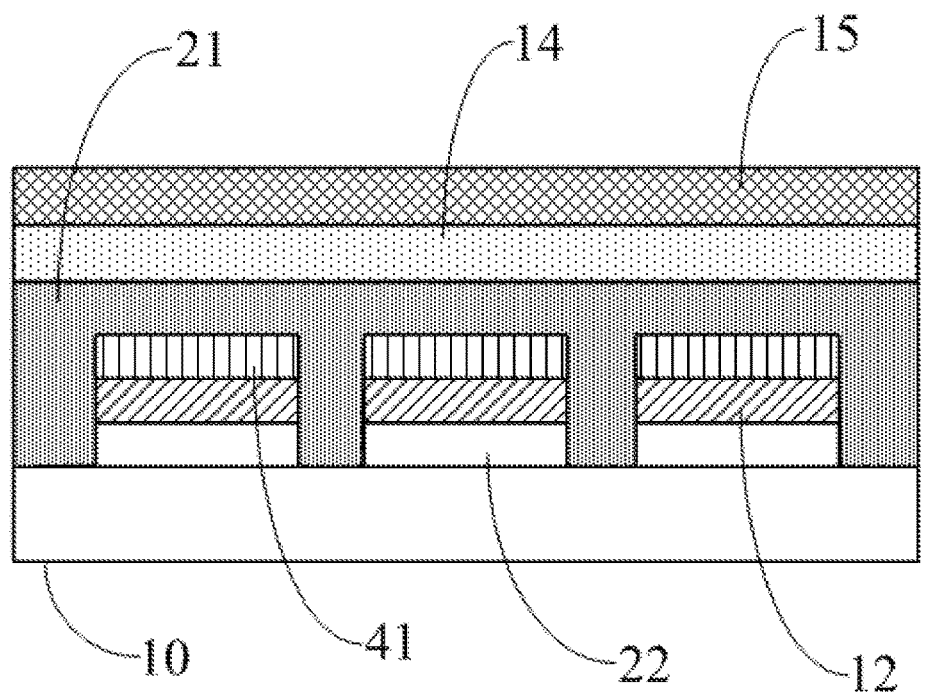
FIG. 4 is a schematic structural view of an organic electroluminescent display panel according to another embodiment of the present disclosure.

As illustrated in FIG. 4, the organic electroluminescent display panel according to one embodiment of the present discourse further comprises a hole injection layer 41 located on the side of the organic light emitting layer 14 facing the anode 12, for example, the hole injection layer 41 can be provided between the anode 12 and the semiconductor layer 21, or the hole injection layer can be provided between the semiconductor layer 21 and the organic light emitting layer 14. In this case, only the structure in which the hole injection layer 41 is located between the anode 12 and the semiconductor layer 21 is illustrated. The hole injection layer 41 can be made of a material of the conventional art and will not be elaborated here. The arrangement of the hole injection layer 41 is better facilitating the injection of holes into the organic light emitting layer 14.

In one embodiment of the present disclosure, the semiconductor layer 21 is located between the cathode 15 and the organic light emitting layer 14, and the hole injection layer 41 is located between the anode 12 and the organic light emitting layer 14.

Figure 5:
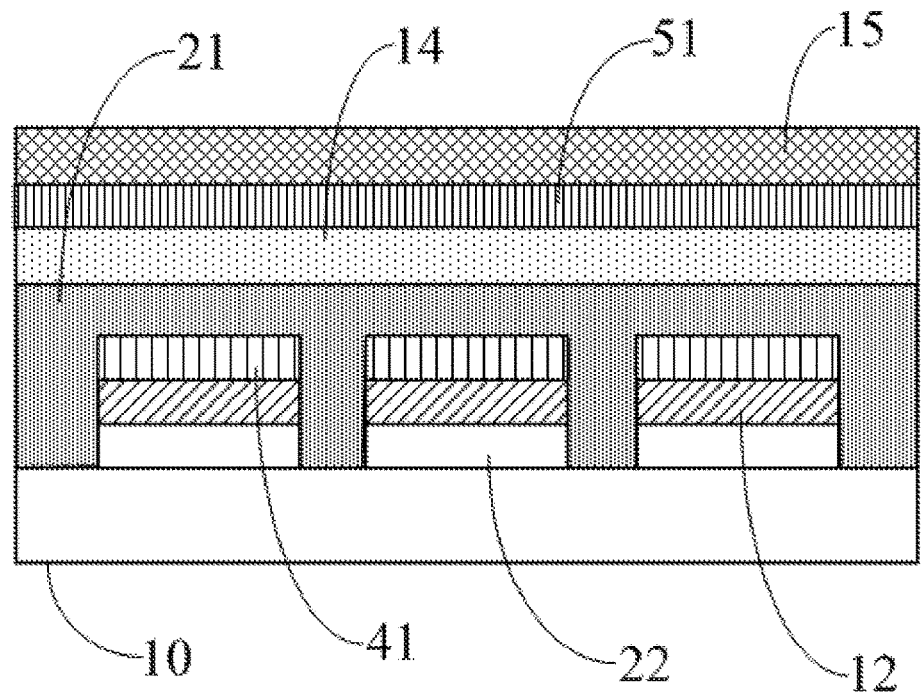
FIG. 5 is a schematic structural view of an organic electroluminescent display panel according to still another embodiment of the present disclosure.

In one embodiment of the present disclosure, as illustrated in FIG. 5, the organic electroluminescent display panel further comprises an electron transport layer 51 on the side of the organic light emitting layer 14 facing the cathode 15, the electron transport layer 51 can be made of a material of the conventional art and will not be elaborated here. The arrangement of the electron injection layer 51 is better facilitating the injection of electrons into the organic light emitting layer 14.

Of course, in this embodiment, if the semiconductor layer 21 is located between the cathode 15 and the organic light emitting layer 14, the electron transport layer 51 can be provided between the cathode 15 and the semiconductor layer 21, or can be provided between the semiconductor layer 21 and the organic light emitting layer 14.

Figure 6:
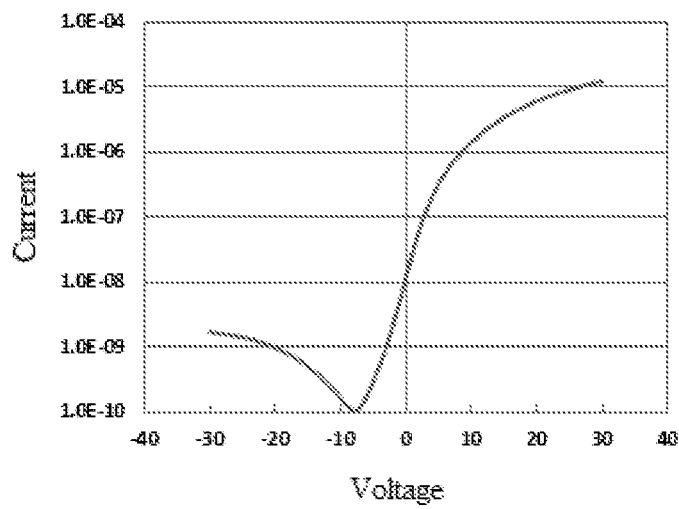
FIG. 6 is a current-voltage plot of a semiconductor layer in an organic electroluminescent display panel according to one embodiment of the present disclosure.

In the embodiment of the present disclosure, the value of current flowing through the semiconductor layer 21 is larger than the value of current required for lightening the organic electroluminescent display panel; the value of current flowing through the semiconductor layer 21 is a value of current generated by the semiconductor layer 21 by applying the turn-on voltage of the thin film transistor on the semiconductor 21 when the thin film transistor in the thin film transistor array circuit 22 is turned on. For example, the semiconductor layer 21 will be described as an amorphous silicon semiconductor layer. FIG. 6 shows the current-voltage curve of the amorphous silicon semiconductor layer. The turn-on voltage for the thin film transistor is typically 7V. When the thin film transistor is turned on, a current flowing the amorphous silicon semiconductor layer is about 10E-7A-10E-8A, which is greater than the current of 5 nA required for lightening the organic electroluminescent display panel, so that the semiconductor layer 21 does not affect the light emission of the organic electroluminescent display panel.

Figure 7:
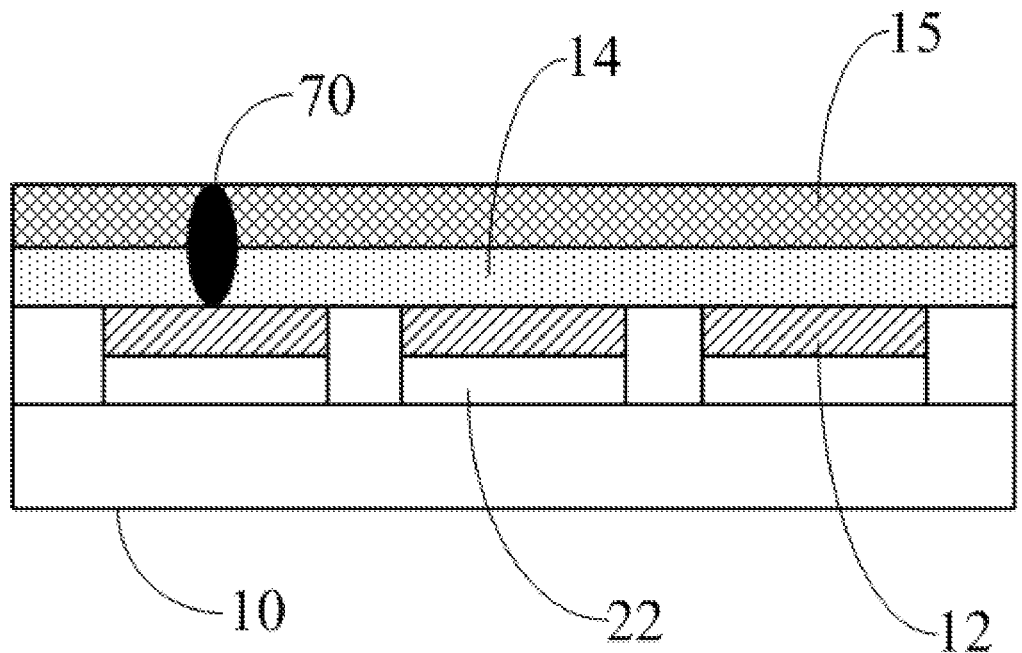
FIG. 7 is a schematic view of an organic electroluminescent display panel without a semiconductor layer when conductive particles are present.
Figure 8:
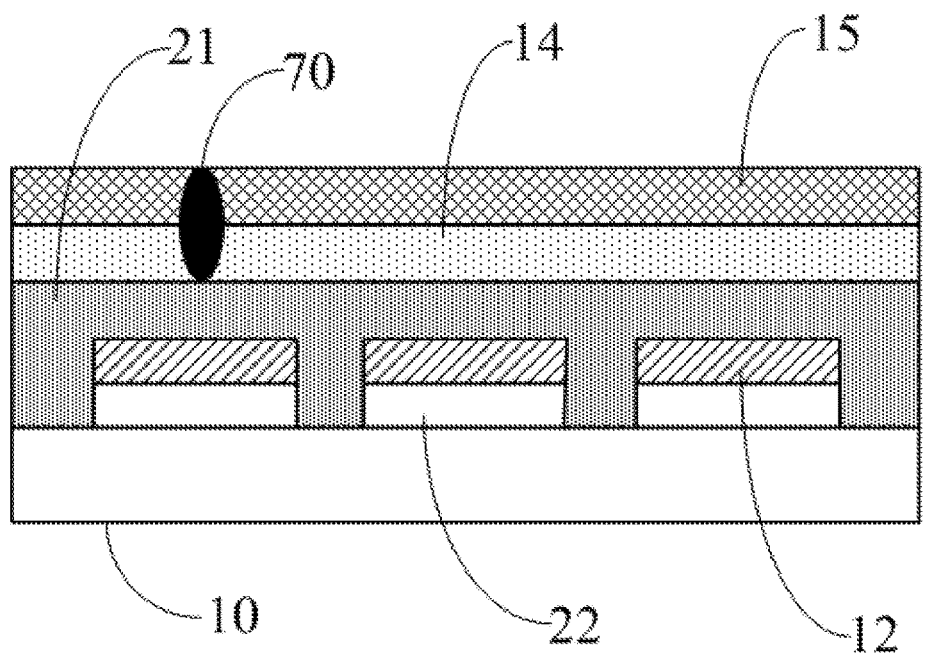
FIG. 8 is a schematic view of an organic electroluminescent display panel with a semiconductor layer when conductive particles are present.

Next, the case that the organic light-emitting layer 14 is vapor-deposited in the presence of conductive particles is described with reference to FIGS. 7 and 8.

In the conventional art, the semiconductor electroluminescent display panel is not provided with a semiconductor layer. As illustrated in FIG. 7, the presence of the conductive particles 70 causes the cathode 15 to short-circuit with the anode 12. At this time, the resistance of the organic electroluminescent display panel changes from meg ohm to 0, the current increases by a thousand times, affecting the brightness of surrounding pixels, Or destroying the surrounding pixels.

A semiconductor layer is provided in the organic electroluminescent display panel according to the present embodiment. When the organic light-emitting layer 14 is vapor-deposited, if there are conductive particles deposited, the presence of the conductive particles 70 causes the cathode 15 to be connected to the semiconductor layer 21, as illustrated in FIG. 8. That the semiconductor layer 21 is an amorphous silicon semiconductor layer is taken as an example to explain. It can be determined from the current-voltage curve relationship of the amorphous silicon semiconductor layer illustrated in FIG. 6 that, the resistance of the semiconductor layer 21 is of mega-ohms, which is equivalent to the resistance of the organic electroluminescent display panel. Even if the conductive particles 70 are present, there is no substantial difference between the pixel current flowing through the organic electroluminescence display panel and the pixel current flowing through the organic electroluminescent display panel in the absence of the conductive particles 70. No short circuit occurs in the pixel units in which the conductive particles 70 are present, but will not affect the surrounding pixels.

Based on the same inventive concept, at least one embodiment of the present disclosure further provides a display device comprising the organic electroluminescent display panel as described above according to the embodiments of the present disclosure, which can be an OLED display, an OLED television, or Electronic paper and other display devices.

Figure 9A:
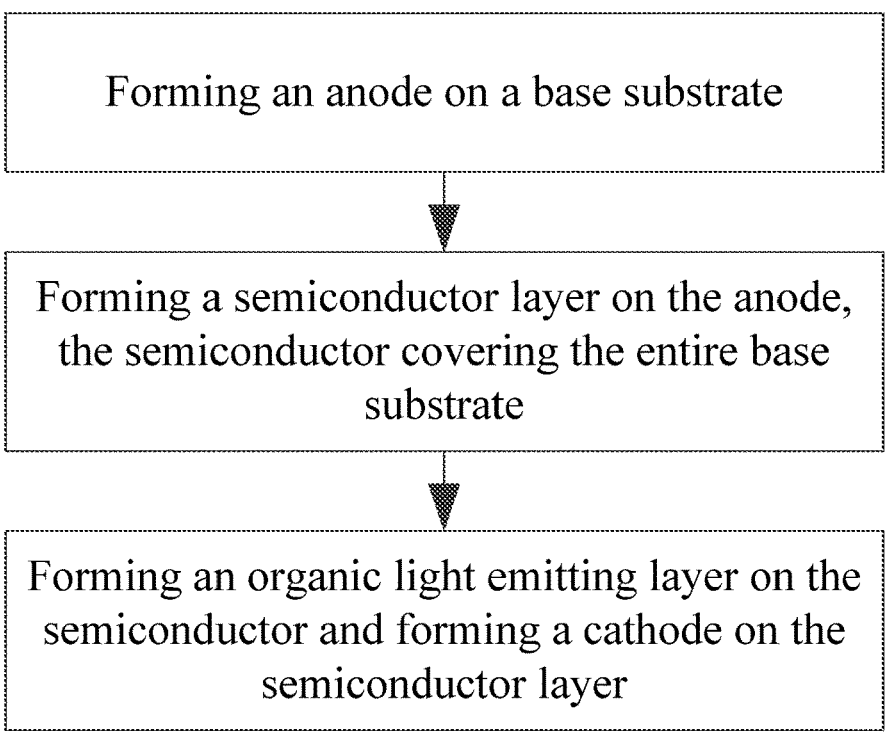
FIGS. 9a and 9b are flowcharts of a method for manufacturing an organic electroluminescent display panel according to one embodiment of the present disclosure.

Based on the same inventive concept, at least one embodiment of the present disclosure further provides a method for manufacturing an organic electroluminescent display panel, as illustrated in FIG. 9a, the method comprising: forming an anode on a base substrate; forming a semiconductor layer on the anode, the semiconductor layer covering the entire base substrate; and forming an organic light emitting layer on the semiconductor layer, and forming a cathode on the organic light emitting layer.

In the embodiments of the present disclosure, forming a semiconductor layer does not require a mask, which saves one exposure process, saves a mask and increases the light emitting area of the pixel, as compared to conventional arts.

In the embodiments of the present disclosure, the method for forming an anode on a base substrate is the same as that of the conventional arts and will not be elaborated.

In one embodiment of the present disclosure, forming a semiconductor layer on the anode comprises depositing a semiconductor layer on the anode by chemical vapor deposition, the semiconductor layer being an organic compound semiconductor layer, or an amorphous semiconductor layer, or an oxide semiconductor layer. Of course, it is also possible to deposit a semiconductor layer on the anode by a thermal evaporation. The method for forming a semiconductor is not limited in the present disclosure.

As an alternative embodiment of the present disclosure, a semiconductor layer is located between the organic light emitting layer and the cathode.

In one embodiment of the present disclosure, an organic light emitting layer is formed on the semiconductor layer, and a cathode is formed on the organic light-emitting layer. The method for forming the organic light-emitting layer and the cathode is the same as that of conventional arts, and will not be elaborated here.

In one embodiment of the present disclosure, prior to forming an anode on a base substrate, a plurality of thin film transistor array circuits arranged in matrix is formed on the base substrate. The method for forming the thin film transistor array circuit is the same as that of conventional arts, and will not be elaborated here.

In one embodiment of the present disclosure, the method further comprises forming a hole injection layer prior to forming the semiconductor layer and after forming the anode, or forming a hole injection layer before forming the organic light emitting layer and after forming the semiconductor layer. The method for forming the hole injection layer is the same as conventional arts, and will not be elaborated here. The position of the hole injection layer can be seen in FIG. 5.

In one embodiment of the present disclosure, the method further comprises forming an electron transport layer between the organic light emitting layer and the cathode, and the method for forming the electron transport layer is the same as that of conventional arts and will not be elaborated again. The position of the electron transport layer can be seen in FIG. 5.

Figure 9B:
Figure 9B:

In accordance with the same inventive concept, at least one embodiment of the present disclosure further provides another method of fabricating an organic electroluminescent display panel, as illustrated in FIG. 9b, the method comprising: forming a cathode on the base substrate; forming a semiconductor layer on the cathode, the semiconductor layer covering the entire base substrate; and forming an organic light-emitting layer on the semiconductor layer, and forming an anode on the organic light-emitting layer In the embodiment of the present disclosure, the method for forming the cathode, the organic light-emitting layer and the anode is the same as that of conventional arts, and will not be elaborated here.

For example, in one embodiment of the present disclosure, forming a semiconductor layer on the cathode comprises depositing a semiconductor layer by chemical vapor deposition on the cathode. Of course, during the actual production, a semiconductor layer can be deposited on the anode by thermal evaporation, and the method for forming the semiconductor layer is not limited in the embodiments of the present disclosure. In the actual production process, in the embodiment of the present disclosure, it is also possible to form a semiconductor layer between the organic light emitting layer and the anode.

In one embodiment of the present disclosure, the method further comprises forming a hole injection layer between the anode and the organic light emitting layer, the method for forming the hole injection layer is the same as that of conventional arts, and will not be elaborated here.

In one embodiment of the present disclosure, the method further comprises forming an electron transport layer between the cathode and the semiconductor layer; or forming an electron transport layer between the semiconductor layer and the organic light emitting layer, the method for forming the electron transport layer is the same as that of conventional arts, and will not be elaborated here.

In summary, at least one embodiment of the present disclosure provides an organic electroluminescent display panel comprising a base substrate, an anode and a cathode on the base substrate, and an organic light emitting layer positioned between the anode and the cathode, wherein the organic electroluminescent display panel further comprises a semiconductor layer covering the entire base substrate; the semiconductor layer located between the anode and the organic light emitting layer; or, the semiconductor layer located between the cathode and the organic light emitting layer. Since the organic electroluminescent display panel in the present embodiment comprises a semiconductor layer covering the entire base substrate, the semiconductor layer has a low conductivity in usual cases and serves to coat the edge of the anode, and therefore, the present embodiments of the present disclosure can remove the pixel definition layer in conventional arts, thereby increasing the light-emitting area of pixel.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201611208526.4 filed on Dec. 23, 2016, the disclosure of which is hereby entirely incorporated by reference.

The invention claimed is:

1. An organic electroluminescent display panel comprising:
a base substrate, a first electrode and a second electrode on the base substrate, and an organic light emitting layer located between the first electrode and the second electrode, wherein the first electrode is closer to the base substrate than the second electrode,
wherein the organic electroluminescent display panel further comprises a semiconductor layer covering the entire base substrate of the display panel, wherein the semiconductor layer is located between the organic light emitting layer and one of the first electrode and the second electrode,
wherein the semiconductor layer comprises a first portion and a second portion, an orthographic projection of the first portion of the semiconductor layer on the first electrode overlaps the first electrode, the second portion of the semiconductor layer covers a side surface of the first electrode, the side surface of the first electrode is crossed with a plane where the base substrate is located, and the first portion of the semiconductor layer and the second portion of the semiconductor layer are integral.

2. The organic electroluminescent display panel according to claim 1, wherein a value of current flowing through the semiconductor layer is greater than a value of current required for lightening the organic electroluminescent display panel, the value of current flowing through the semiconductor layer is a value of current corresponding to a turn-on voltage of a thin film transistor when the thin film transistor in a thin film transistor array circuit in the organic electroluminescent display panel is turned-on.

3. The organic electroluminescent display panel according to claim 1, wherein the semiconductor layer is made of an organic compound semiconductor, an amorphous semiconductor, or an oxide semiconductor.

4. The organic electroluminescent display panel according to claim 1, wherein a thickness of the semiconductor layer is in a range of 500 Å to 1000 Å.

5. The organic electroluminescent display panel according to claim 1, wherein the first electrode is made of a metal material or a transparent conductive material, and the second electrode is made of a metal material or a transparent conductive material.

6. The organic electroluminescent display panel according to claim 1, wherein the organic electroluminescent display panel further comprises a hole injection layer located between the first electrode and the organic light emitting layer.

7. The organic electroluminescent display panel according to claim 6, wherein the semiconductor layer is located between the first electrode and the organic light emitting layer, the hole injection layer is located between the first electrode and the semiconductor layer or between the semiconductor layer and the organic light emitting layer; or if the semiconductor layer is located between the second electrode and the organic light emitting layer, the hole injection layer is located between the first electrode and the organic light emitting layer.

8. The organic electroluminescent display panel according to claim 1, wherein the organic electroluminescent display panel comprises an electron transport layer located between the second electrode and the organic light emitting layer.

9. The organic electroluminescent display panel according to claim 8, wherein if the semiconductor layer is located between the first electrode and the organic light emitting layer, the electron transport layer is located between the organic light emitting layer and the second electrode; or if the semiconductor layer is located between the second electrode and the organic light emitting layer, the electron transport layer is located between the second electrode and the semiconductor layer or between the semiconductor layer and the organic light emitting layer.

10. A display device comprising the organic electroluminescent display panel according to claim 1.

11. The organic electroluminescent display panel according to claim 1, wherein the first electrode is an anode, the second electrode is a cathode; or
the first electrode is a cathode, the second electrode is an anode.

12. The organic electroluminescent display panel according to claim 1, wherein the second portion of the semiconductor layer covers a side surface of a hole injection layer, and the side surface of the hole injection layer is crossed with the plane where the base substrate is located.

13. An organic electroluminescent display panel, comprising a base substrate, a first electrode and a second electrode on the base substrate, and an organic light emitting layer located between the first electrode and the second electrode,
wherein the organic electroluminescent display panel further comprises a semiconductor layer covering the entire base substrate, wherein the semiconductor layer is located between the organic light emitting layer and one of the first electrode and the second electrode,
the semiconductor layer is made of an amorphous semiconductor, and
the amorphous semiconductor is made of an amorphous silicon semiconductor.

14. A method for manufacturing an organic electroluminescent display panel comprising forming a first electrode, an organic light emitting layer, and a second electrode on a base substrate, wherein the first electrode is closer to the base substrate than the second electrode, the method further comprises: forming a semiconductor layer between the first electrode and the second electrode, wherein the semiconductor layer covers the entire base substrate of the display panel,
wherein the semiconductor layer comprises a first portion and a second portion, an orthographic projection of the first portion of the semiconductor layer on the first electrode overlaps the first electrode, the second portion of the semiconductor layer covers a side surface of the first electrode, the side surface of the first electrode is crossed with a plane where the base substrate is located, and the first portion of the semiconductor layer and the second portion of the semiconductor layer are integral.

15. The method according to claim 14, wherein, prior to forming the semiconductor layer between the first electrode and the second electrode, the method comprises: forming the first electrode on the base substrate; and depositing the semiconductor layer on the first electrode through chemical vapor deposition.

16. The method according to claim 15, further comprising forming a hole injection layer between the first electrode and the organic light emitting layer.

17. The method according to claim 15, further comprising forming an electron transport layer between the organic light emitting layer and the second electrode.

18. The method according to claim 14, wherein, prior to forming the semiconductor layer between the first electrode and the second electrode, the method comprises: forming the second electrode on the base substrate; and depositing the semiconductor layer on the second electrode through chemical vapor deposition.

19. The method according to claim 14, wherein prior to forming the first electrode, the organic light emitting layer, and the second electrode on the base substrate, the method comprises: forming a plurality of thin film transistor array circuits arranged in matrix on the base substrate; a value of current flowing through the semiconductor layer is greater than a value of current required for lightening the organic electroluminescent display panel; and the value of current flowing through the semiconductor layer is a value of current corresponding to a turn-on voltage of the thin film transistor when the thin film transistor in the thin film transistor array circuit is turned on.

20. The method according to claim 14, wherein the semiconductor layer is made of an organic compound semiconductor, an amorphous semiconductor, or an oxide semiconductor.

* * * * *

UNITED STATES PATENT AND TRADEMARK OFFICE
CERTIFICATE OF CORRECTION

PATENT NO. : 10,461,136 B2
APPLICATION NO. : 15/566510
DATED : October 29, 2019
INVENTOR(S) : Zhang et al.

It is certified that error appears in the above-identified patent and that said Letters Patent is hereby corrected as shown below:

On the Title Page

Item (30) Foreign Application Priority Data, Column 1, Lines 1-2:
After item (65) Prior Publication Data and before item (51) Int. Cl.,
Insert:
--(30) Foreign Application Priority Data
Dec. 23, 2016 (CN)............201611208526.4--

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*